(12) United States Patent
Yokogawa et al.

(10) Patent No.: US 8,496,781 B2
(45) Date of Patent: Jul. 30, 2013

(54) PLASMA PROCESSING APPARATUS

(75) Inventors: Kenetsu Yokogawa, Turugama (JP);
Kenji Maeda, Kudamatu (JP); Masaru Izawa, Hino (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1398 days.

(21) Appl. No.: 11/182,793

(22) Filed: Jul. 18, 2005

(65) Prior Publication Data

US 2006/0016560 A1    Jan. 26, 2006

(30) Foreign Application Priority Data

Jul. 20, 2004    (JP) .................. 2004-211243

(51) Int. Cl.
*C23C 16/00*    (2006.01)
*C23F 1/00*    (2006.01)
*H01L 21/306*    (2006.01)
*H05B 31/26*    (2006.01)

(52) U.S. Cl.
USPC ............ 156/345.44; 156/345.43; 156/345.45; 156/345.46; 156/345.47; 156/345.34; 118/723 E; 315/111.21

(58) Field of Classification Search
USPC . 156/345.43–345.47; 315/111.21; 118/723 E
See application file for complete search history.

(56) References Cited

U.S. PATENT DOCUMENTS 4,812,712 A * 3/1989 Ohnishi et al. ............... 315/176
5,298,103 A * 3/1994 Steinberg et al. ......... 156/345.43
5,534,751 A * 7/1996 Lenz et al. ............... 315/111.71

(Continued)

FOREIGN PATENT DOCUMENTS

JP    62-180883    11/1987
JP    10-290108    10/1998

(Continued)

OTHER PUBLICATIONS

Sumiya et al., "Energy Control of Incident Ions to the Chamber-Wall to Using Push-Pull Bias (Phase-Controlled Bias) in UHF-ECR Etcher", 2003 Dry Process International Symposium, pp. 43-49.

(Continued)

*Primary Examiner* — Rakesh Dhingra
(74) *Attorney, Agent, or Firm* — Stites & Harbison PLLC; Juan Carlos A. Marquez, Esq.; Stephen J. Weyer, Esq.

(57) ABSTRACT

The invention provides a plasma processing apparatus which is based upon a dry etching apparatus and which can inhibit the contamination of a work piece caused by sputtering onto a wall of a vacuum chamber, the occurrence of a foreign matter, the increase of a running cost for replacing the walls of the vacuum chamber and the deterioration of a rate of operation. The plasma processing apparatus according to the invention is based upon the dry etching apparatus having parallel plate structure and is characterized in that a low-pass filter having high impedance to a frequency of a high frequency power source for generating discharge, having small resistance to direct current and grounded is connected to an electrode for generating discharge which is arranged in a position opposite to the work piece and to which the high frequency power source for generating discharge is connected or a low-pass filter having small resistance to direct current and grounded and a direct-current power source connected in series with it are connected to the electrode for generating discharge.

9 Claims, 4 Drawing Sheets

U.S. PATENT DOCUMENTS

| | | | |
|---|---|---|---|
| 5,721,021 A * | 2/1998 | Tobe et al. | 427/570 |
| 5,728,278 A * | 3/1998 | Okamura et al. | 204/298.11 |
| 5,755,938 A * | 5/1998 | Fukui et al. | 204/298.23 |
| 5,891,349 A * | 4/1999 | Tobe et al. | 216/68 |
| 5,926,689 A * | 7/1999 | Cote et al. | 438/10 |
| 6,083,344 A * | 7/2000 | Hanawa et al. | 156/345.28 |
| 6,406,545 B2 * | 6/2002 | Shoda et al. | 118/724 |
| 6,462,482 B1 * | 10/2002 | Wickramanayaka et al. | 315/111.21 |
| 6,485,602 B2 * | 11/2002 | Hirose | 156/345.44 |
| 6,719,875 B1 * | 4/2004 | Ohmi et al. | 156/345.47 |
| 2002/0007915 A1 * | 1/2002 | Hirose | 156/345 |
| 2003/0010453 A1 * | 1/2003 | Tanaka et al. | 156/345.38 |
| 2003/0037881 A1 * | 2/2003 | Barnes et al. | 156/345.44 |
| 2004/0149221 A1 * | 8/2004 | Koshimizu et al. | 118/723 R |
| 2005/0061445 A1 * | 3/2005 | Koshiishi et al. | 156/345.47 |
| 2005/0167052 A1 * | 8/2005 | Ishihara et al. | 156/345.47 |
| 2005/0224180 A1 * | 10/2005 | Bera et al. | 156/345.33 |

FOREIGN PATENT DOCUMENTS

| | | |
|---|---|---|
| JP | 11-102898 | 4/1999 |
| JP | 11-204292 | 7/1999 |
| JP | 2000-114906 | 4/2000 |
| JP | 2002-016045 | 6/2000 |
| JP | 2002-043286 | 7/2000 |
| JP | 2000-323460 | 11/2000 |
| JP | 2001-094315 | 4/2001 |
| JP | 2002-184766 | 9/2001 |
| JP | 2003-124198 | 4/2003 |
| WO | WO 0068985 | * 11/2000 |

OTHER PUBLICATIONS

Japanese Patent Office Notification of Reasons for Refusal, mail date Feb. 16, 2010.

* cited by examiner

ION INCIDENT ENERGY
TO VACUUM CHAMBER
= 1/2·Vpp-Vdc

PRIOR ART

ION INCIDENT ENERGY
TO VACUUM CHAMBER
$= 1/2 \cdot V_{pp} - V_{dc} \approx 0$

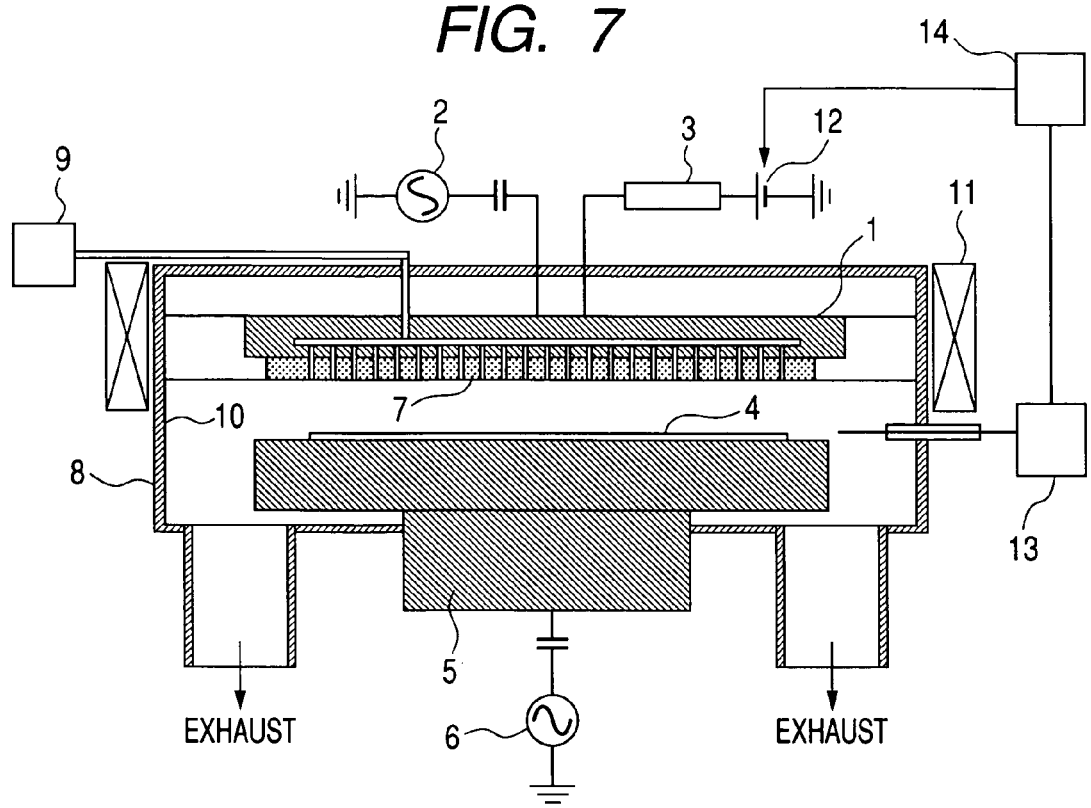
FIG. 7
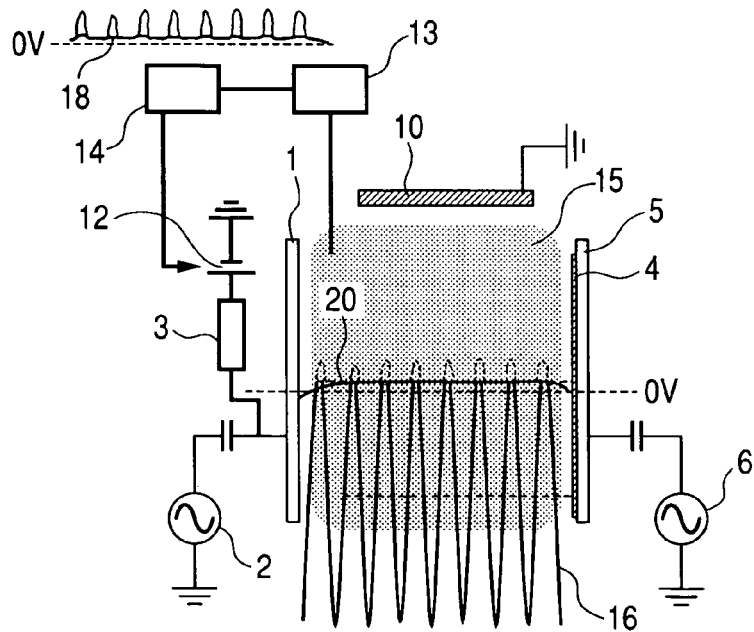
FIG. 8(a)
FIG. 8(b)
ION INCIDENT ENERGY
TO VACUUM CHAMBER ≒ Vp

PLASMA PROCESSING APPARATUS

CLAIM OF PRIORITY

The present invention claims priority from Japanese Application JP 2004-211243 filed on Jul. 20, 2004, the content of which is hereby incorporated by reference to this application.

BACKGROUND OF THE INVENTION

The present invention relates to a semiconductor manufacturing apparatus for manufacturing a semiconductor device, particularly relates to dry etching technology for etching semiconductor material using plasma.

The dry etching technology is technique for etching semiconductor material such as silicon and a silicon oxide film by plasma using a minute contour patterned by resist material for a mask by lithography using light or an electron beam so as to acquire a desired form, and is one of indispensable techniques in a semiconductor manufacturing process. In dry etching, a part except a masked part of the surface of a sample is etched by pumping material gas into a vacuum chamber provided with exhaust means, turning the material gas into plasma by an electromagnetic wave and exposing a sample to it and a desired form is acquired. High frequency voltage different from high frequency voltage for producing plasma is applied to the sample, the efficiency of etching is enhanced, and the perpendicularity of the form of the sample is acquired by accelerating ions in plasma by the high frequency voltage and making them incident upon the surface of the sample.

In a conventional type dry etching apparatus, in etching, plasma potential is made higher than earth potential by voltage of a frequency for discharge for producing plasma or high frequency voltage applied to a sample. Accelerated ions out of plasma are incident upon a wall of a vacuum chamber at earth potential by the rise of the plasma potential and the wall of the vacuum chamber is sputtered. When the wall of the vacuum chamber is sputtered, the material of the wall of the vacuum chamber or a compound of the materials of the wall of the vacuum chamber is splashed on the sample to be a source of contamination and a foreign matter and the manufacturing yield of the sample which is a semiconductor device is deteriorated. Besides, as the wall of the vacuum chamber is wasted by sputtering, it is required to be regularly replaced, a running cost of the dry etching apparatus is increased, and the rate of operation is deteriorated.

For a solution of the problem, a method of applying the same frequency different by 180 degrees in a phase from high frequency voltage applied to the sample to an electrode for generating discharge arranged in a position opposite to the sample is proposed (for example, refer to Japanese Patent Application Laid-Open No. 2002-184766 (patent document 1) and pp. 43 to 48 of 2003 Proceedings of International Symposium on Dry Process (non-patent document 1)). As the opposite electrode is turned at negative potential in a positive-voltage cycle of the high frequency voltage applied to the sample by applying the high frequency voltage different by 180 degrees in a phase from the high frequency voltage applied to the sample to the electrode for generating discharge, the rise of plasma potential is suppressed and the sputtering of the wall of the vacuum chamber is suppressed.

Besides, a method of providing a filter to the electrode for generating discharge to make the high frequency voltage applied to the sample efficiently flow from the electrode for generating discharge to the earth is proposed (for example, refer to Japanese Patent Application Laid-Open No. 2002-43286 (patent document 2)).

Besides, a method of inserting a filter having the length of a wavelength equivalent to ¼ of a frequency for discharge into a sample mounting electrode is proposed (for example, refer to Japanese Patent Application Laid-Open No. 2002-16045 (patent document 3)).

SUMMARY OF THE INVENTION

As described above, in the conventional type dry etching apparatus, in etching, plasma potential is made higher than earth potential by the voltage of a frequency for discharge for producing plasma or the high frequency voltage applied to the sample. Accelerated ions out of plasma are incident upon the wall of the vacuum chamber at earth potential by the rise of plasma potential and the wall of the vacuum chamber is sputtered. As the material of the wall of the vacuum chamber or a compound for the wall of the vacuum chamber is emitted into the vacuum chamber by the sputtering of the wall of the vacuum chamber, it causes the contamination of the sample and the creation of a contaminant. Besides, as the wall of the vacuum chamber is wasted, replacement is required and it causes the rise of a running cost of the dry etching apparatus and the deterioration of the rate of operation.

In the meantime, in the conventional type methods disclosed in the above-mentioned patent document 1 and non-patent document 1, the high frequency power source the phase of which is controlled is required and the problem that the apparatus is large-sized and the cost is increased occurs. Besides, precise phase control is required and there is a case that sufficient effect is not acquired in case waveform distortion is caused depending upon a condition. Besides, a capacitor is inserted in series into the filter used in the above-mentioned patent document 2 and effect for inhibiting the rise of plasma potential is extremely small. Besides, the filter disclosed in the above-mentioned patent document 3 is also provided to electrostatically adsorb the sample on the sample mounting electrode and has no effect for inhibiting the rise of plasma potential.

Then, the object of the invention is to provide a plasma processing apparatus which is based upon a dry etching apparatus and in which the contamination caused by the sputtering of a wall of a vacuum chamber of a sample and the creation of a contaminant can be suppressed and the increase of a running cost and the deterioration of the rate of operation respectively by the replacement of the walls of the vacuum chamber can be suppressed.

To achieve the object, the plasma processing apparatus according to the invention is characterized as follows.

(1) The plasma processing apparatus according to the invention is provided with sample mounting means for mounting a sample, an electrode for generating discharge arranged in a position opposite to the sample mounted on the sample mounting means, means for applying high frequency voltage to the sample mounting means, means for applying high frequency voltage for generating discharge to the electrode for generating discharge and magnetic field generating means for generating a magnetic field for turning predetermined gas into plasma by interaction with a high frequency for discharge applied by the electrode for generating discharge respectively in the vacuum chamber, and is characterized in that a low-pass filter having high impedance to a frequency of the high frequency voltage for generating discharge, having small resistance to direct current and grounded is provided to the electrode for generating discharge.

(2) The plasma processing apparatus according to the invention is provided with sample mounting means for mounting a sample, an electrode for generating discharge arranged in a position opposite to the sample mounted on the sample mounting means, means for applying high frequency voltage to the sample mounting means, means for applying high frequency voltage for generating discharge to the electrode for generating discharge and a magnetic field generating means for generating a magnetic field for turning predetermined gas into plasma by interaction with a high frequency for discharge applied by the electrode for generating discharge respectively in a vacuum chamber, and is characterized in that a low-pass filter having high impedance to a frequency of the high frequency voltage for generating discharge, having small resistance to direct current and grounded and dc voltage applying means connected in series between the low-pass filter and the earth are provided to the electrode for generating discharge.

(3) The plasma processing apparatus according to the invention is based upon the plasma processing apparatus described in (2) and is characterized in that plasma potential control means for detecting plasma potential and controlling voltage applied to the dc voltage applying means corresponding to the variation of plasma potential is provided.

According to the invention, a semiconductor manufacturing apparatus which is based upon the dry etching apparatus and in which the contamination caused by the sputtering of the wall of the vacuum chamber of the sample, the creation of a contaminant can be suppressed and the increase of a running cost and the deterioration of the rate of operation respectively caused by the replacement of the walls of the vacuum chamber can be suppressed can be realized.

BRIEF DESCRIPTION OF THE DRAWINGS

FIG. 4(a) shows a case using an inductor, FIG. 4(b) shows structure that capacitors are connected to both ends of an inductor and between the inductor and the earth, and FIG. 4(c) shows a case using a characteristic impedance conductor;

FIG. 7 is an explanatory drawing for explaining basic configuration in a third embodiment; and FIG. 8(a) shows a voltage waveform of a surface of a work piece in the third embodiment and FIG. 8(b) shows the temporal variation of plasma potential.

DETAILED DESCRIPTION OF THE PREFERRED EMBODIMENTS

Figure 1:
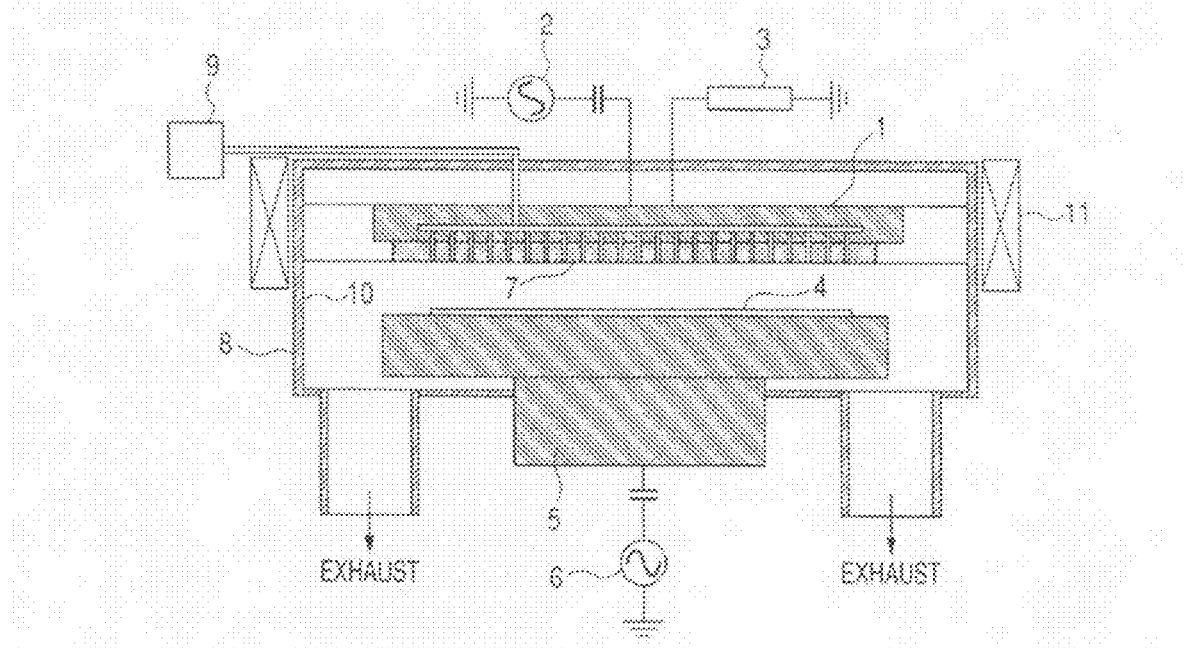
FIG. 1 is an explanatory drawing for explaining basic configuration in a first embodiment.

Referring to the drawings, embodiments of the invention will be described in detail below.

First Embodiment

FIG. 1 shows basic configuration in a first embodiment. This embodiment is based upon a dry etching apparatus having parallel plate structure in which a high frequency power source is connected to a wafer mounting electrode for mounting a wafer and further, a high frequency power source for generating discharge is connected to an electrode for generating discharge arranged in a position opposite to the wafer, and is characterized in that structure that a low-pass filter having high impedance to a frequency of high frequency voltage for generating discharge, having small resistance to direct current and grounded is inserted into the electrode for generating discharge is provided.

As shown in FIG. 1, the high frequency power source for generating discharge 2 (in this embodiment, 200 MHz) is connected to the electrode for generating discharge 1 and further, the electrode for generating discharge 1 is grounded via the low-pass filter 3 having small resistance to direct current. The wafer 4 is mounted on the wafer mounting means 5 in a position opposite to the electrode for generating discharge 1. The high frequency power source 6 (in this embodiment, 800 kHz) is connected to the wafer mounting means 5. A shower plate 7 made of silicon is arranged on a surface opposite to the wafer 4 of the electrode for generating discharge 1. The inside of a vacuum chamber 8 is exhausted by vacuum exhaust means and material gas of plasma is pumped in the vacuum chamber 8 via the electrode for generating discharge 1 and the shower plate 7 by gas pumping means 9. A solenoid coil 11 is arranged around the vacuum chamber 8 and plasma is generated by the interaction of a magnetic field generated by the solenoid coil 11 and a high-frequency wave for discharge radiated into the vacuum chamber 8 by the electrode for generating discharge 1.

Next, the operation of this embodiment will be described.

Figure 2A:
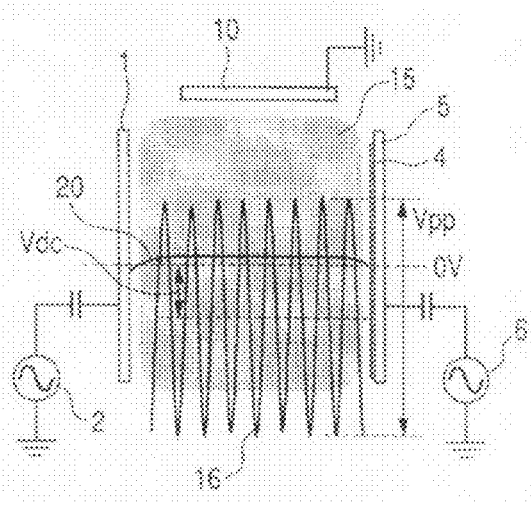
FIG. 2(a) shows a voltage waveform of a surface of a work piece in case the invention is not applied to and FIG. 2(b) shows the temporal variation of plasma potential.
Figure 2B:
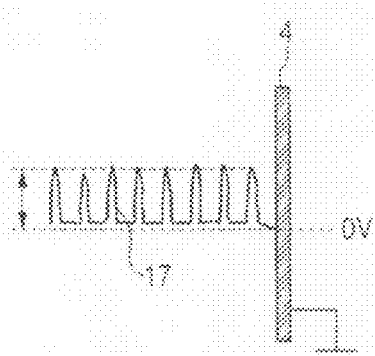

First, for comparison, a case that the low-pass filter 3 according to the embodiment arranged in the electrode for generating discharge 1 and having small resistance to direct current is not used will be described. FIG. 2(a) shows a waveform 16 of voltage applied to a surface of the wafer by the high frequency power source 6 in case the low-pass filter 3 is not used and FIG. 2B shows the temporal variation 17 of plasma potential generated by bias applied to the wafer 4 by the high frequency power source 6. A reference number 15 in FIG. 2A denotes plasma generated between the electrode for generating discharge 1 and the wafer 4 and 20 denotes the temporal variation of plasma potential generated only by a frequency of high frequency voltage for generating discharge by the high frequency power source for generating discharge 2.

As shown in FIG. 2(a), when high frequency voltage (the amplitude of the voltage shall be Vpp) is applied to the wafer 4, the mean potential of the wafer 4 is shifted to the negative side (in FIG. 2(a), Vdc denotes the mean potential shifted to the negative side of the wafer). When the shift to the negative side of the mean potential is $\frac{1}{2} \cdot Vpp$ or more, no rise to the positive side of plasma potential is caused, however, actually as shown in FIG. 2(a), the shift to the negative side of the mean potential is smaller than $\frac{1}{2} \cdot Vpp$, plasma potential for the positive potential of the high frequency voltage applied to the wafer 4 periodically rises, ions having energy for raised plasma potential are incident upon a wall 10 of the vacuum chamber at earth potential when the plasma potential rises, and the wall 10 of the vacuum chamber is sputtered. The energy at this time of the ions incident upon the wall 10 of the vacuum chamber is $\frac{1}{2} \cdot Vpp - Vdc$. That is, FIG. 2(b) shows that if Vdc approaches $\frac{1}{2} \cdot Vpp$ limitlessly, the energy of the ions incident upon the wall 10 of the vacuum chamber decreases.

Figure 3A:
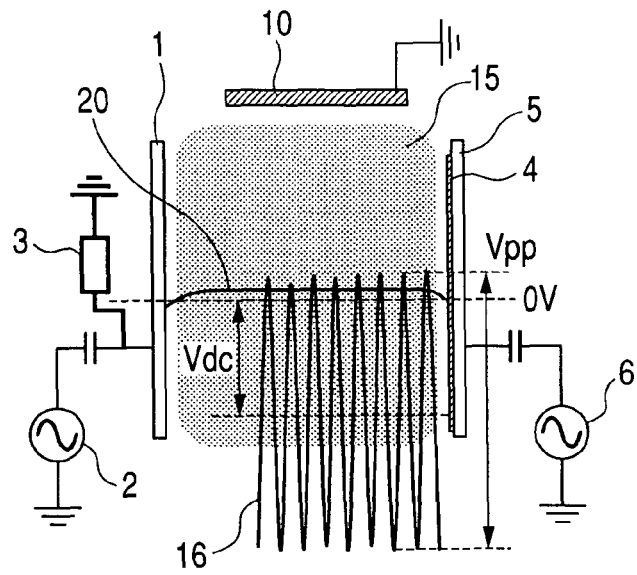
FIG. 3(a) shows a voltage waveform of the surface of the work piece in case the invention is applied to and FIG. 3(b) shows the temporal variation of plasma potential.
Figure 3B:
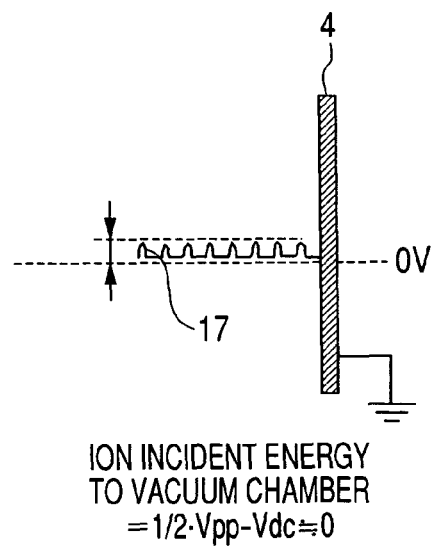

Next, a case that the low-pass filter 3 according to the embodiment arranged in the electrode for generating discharge 1 and having small resistance to direct current is used will be described. FIG. 3(a) shows a waveform 16 of voltage applied to the surface of the wafer by the high frequency power source 6 in case the low-pass filter 3 according to the invention is used and FIG. 3(b) shows the temporal variation 17 of plasma potential generated by bias applied to the wafer 4 by the high frequency power source 6. When the electrode for generating discharge 1 is grounded via the filter having small resistance to direct current, the mean potential of the electrode for generating discharge 1 is constantly kept at earth potential.

In the case shown in FIG. 2 in which the invention is not used, the supply of electrons to plasma from the electrode for generating discharge 1 is limited to the same amount as ionic current which flows into the electrode for generating discharge 1 and an amount which the high frequency power source for discharge 2 can supply. When the mean potential of the electrode for generating discharge 1 is shifted to the negative side, an ion sheath formed on the surface of the electrode for generating discharge becomes thick and the supply of electrons to plasma from the electrode for generating discharge is also inhibited because the impedance of the ion sheath is large. Therefore, the supply of electrons to plasma from the electrode for generating discharge 1 becomes insufficient in a cycle on the positive side of high frequency voltage applied to the wafer 4 and the shift to the negative side of the mean potential of the wafer 1 is inhibited.

In the meantime, when the electrode for generating discharge 1 is grounded via the filter having small resistance to direct current, the mean potential of the electrode for generating discharge 1 is constantly kept at earth potential. As shown in FIG. 3(a), when the mean potential of the electrode for generating discharge 1 is constantly kept at earth potential, the supply of electrons to plasma from the electrode for generating discharge 1 in a cycle on the positive side in which high frequency voltage is applied to the wafer 4 is made not only from the high frequency power source for discharge 2 but from the earth via the low-pass filter 3. As the mean potential of the electrode for generating discharge 1 is constantly kept at earth potential, the width of the ion sheath formed on the surface of the electrode for generating discharge 1 becomes thin, and the electrode for discharge and plasma are bonded at low impedance. "Vdc" of the wafer 4 is increased by these effects. As a result, as shown in FIG. 3(b), ½·Vpp−Vdc≈0 and ion incident energy upon the wall 10 of the vacuum chamber from plasma is inhibited.

By the above-mentioned effect, the sputtering of the wall 10 of the vacuum chamber is inhibited, and the contamination of the wafer 4, the contaminant, the increase of the running cost because of the replacement of walls of the vacuum chamber and the deterioration of the rate of operation of the apparatus can be inhibited. Further, in the embodiment, the inhibition of the rise of plasma potential can be realized constantly securely with the very simple low-cost structure, compared with the prior art disclosed in the above-mentioned patent document 1 and non-patent document 1.

Figure 4A:
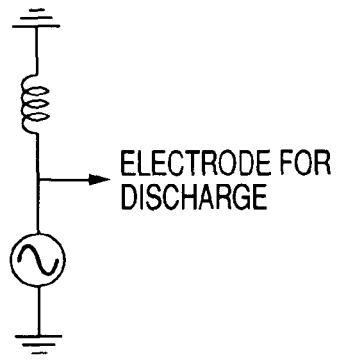
FIGS. 4(a) to 4(c) show concrete examples of a low-pass filter used.
Figure 4B:
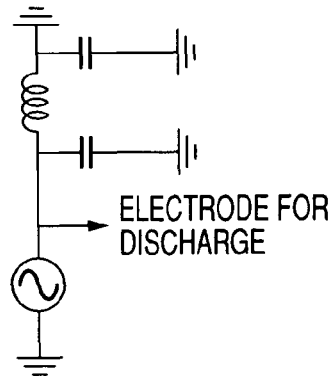
Figure 4C:
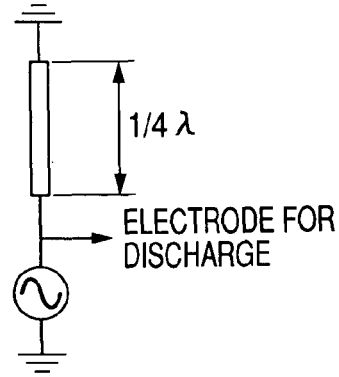

FIGS. 4(a) to 4(c) show concrete examples of the low-pass filter having high impedance to a frequency of the power source for generating discharge shown in FIG. 1, having small resistance to direct current and grounded. FIG. 4(a) shows a case using an inductor and the electrode for generating discharge 1 is grounded via the filter having small resistance to direct current, preventing a frequency for discharge from flowing on the earth side. FIG. 4(b) shows a filter having structure that a capacitor is inserted at both ends of the inductor and between the inductor and the earth. The example shown in FIG. 4(b) has the similar action to the example shown in FIG. 4(a). FIG. 4(c) shows a case using a characteristic impedance conductor having length equivalent to ¼ of a wavelength ë of the frequency for discharge. An electromagnetic wave of a high frequency (for example, 100 MHz or more) has a characteristic that the electromagnetic wave is totally reflected when the length of the conductor having the characteristic impedance is the characteristic length (¼ë). Therefore, the electrode for generating discharge 1 can be grounded in a state having very small resistance by using the characteristic impedance conductor shown in FIG. 4(c), preventing the frequency for discharge from flowing on the side of the earth.

The electrode for generating discharge 1 can be grounded by individually using each filter shown in FIGS. 4(a), 4(b), 4(c) and having small resistance to direct current or combining them, supplying a high frequency for discharge to the electrode for generating discharge 1.

In the embodiment shown in FIG. 1, the solenoid coil 11 is used for generating plasma. A magnetic field generated by the solenoid coil 11 includes a component perpendicular to the surface of the electrode for generating discharge 1 or the wafer 4. Impedance between the electrode for generating discharge 1 and the wafer 4 via plasma is reduced by the magnetic configuration and action for enhancing functions is also provided in addition to a function for controlling the generation of plasma by the magnetic field.

Besides, in the embodiment shown in FIG. 1, to enhance control over the generation of plasma and the functions, the magnetic field by the solenoid coil is used, however, essentially, as the effect of the embodiment can be acquired without a magnetic field, the similar effect can be also expected in configuration provided with no solenoid coil in the embodiment shown in FIG. 1.

Besides, in the embodiment shown in FIG. 1, 200 MHz is used for the high frequency power source for discharge 2, however, in case an electromagnetic wave of 50 MHz or more and of 500 MHz or less is used, there is also the similar effect. In the case of 50 MHz or less, the potential shift caused by a frequency for discharge itself of the electrode for generating discharge is large, large quantity of current constantly flows in the low-pass filter, and the efficiency of discharge is deteriorated. In the case of 500 MHz or more, it is difficult to generate uniform plasma in generating plasma in the parallel plate structure shown in FIG. 1. Similarly, in the embodiment shown in FIG. 1, 800 kHz is used for the high frequency power source 6 for applying an electromagnetic wave to the wafer 4, however, the similar effect can be also acquired with a frequency equal to or exceeding 400 kHz and equal to or less than 15 MHz.

Furthermore, in the embodiment shown in FIG. 1, the shower plate 7 made of silicon is arranged on the side opposite to the wafer 4 of the electrode for generating discharge 1. However, as the similar effect is acquired if only the shower plate 7 is conductive, it need scarcely be said that the similar effect is acquired even if the shower plate is made of another conductor or a semiconductor. Concretely, the similar effect is acquired by using monocrystalline silicon, polycrystalline silicon, amorphous silicon, silicon carbide, aluminum, stainless steel, carbon and glassy carbon.

Second Embodiment

Figure 5:
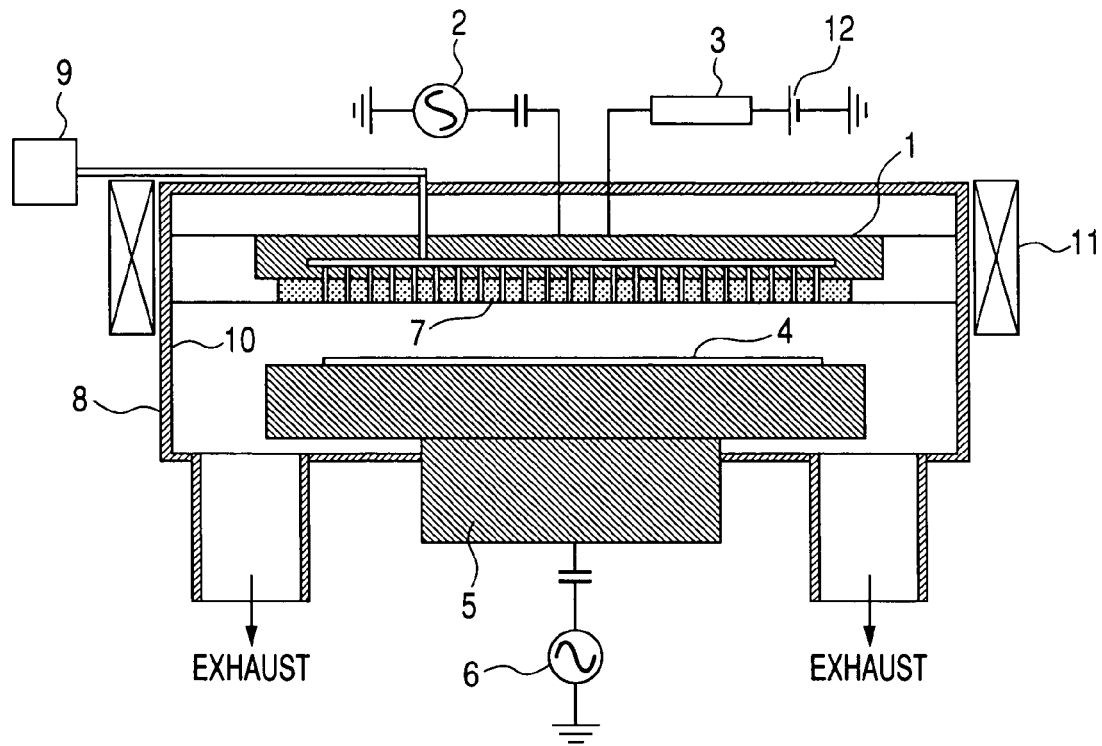
FIG. 5 is an explanatory drawing for explaining basic configuration in a second embodiment.

FIG. 5 shows basic configuration in a second embodiment. This embodiment is based upon a dry etching apparatus having parallel plate structure that a high frequency power source is connected to a wafer mounting electrode for mounting a wafer and further, a power source for generating discharge is connected to an electrode for generating discharge arranged in a position opposite to the wafer, and is characterized in that structure that a direct-current power source is inserted in series into a line including a low-pass filter having high impedance to a frequency of high frequency voltage for generating discharge, having small resistance to direct current and grounded is provided to the electrode for generating discharge.

FIG. 5 shows the embodiment in which the direct-current power source 12 is inserted between the low-pass filter 3 shown in FIG. 1 and the earth in series. The embodiment shown in FIG. 5 enables keeping the mean potential of the electrode for generating discharge 1 at dc voltage output from the direct-current power source 12 and enables freely adjusting the mean potential of the electrode for generating discharge 1. Concretely, positive potential of 10 to 30 V is applied to the electrode for generating discharge 1 by the direct-current power source 12.

Figure 6A:
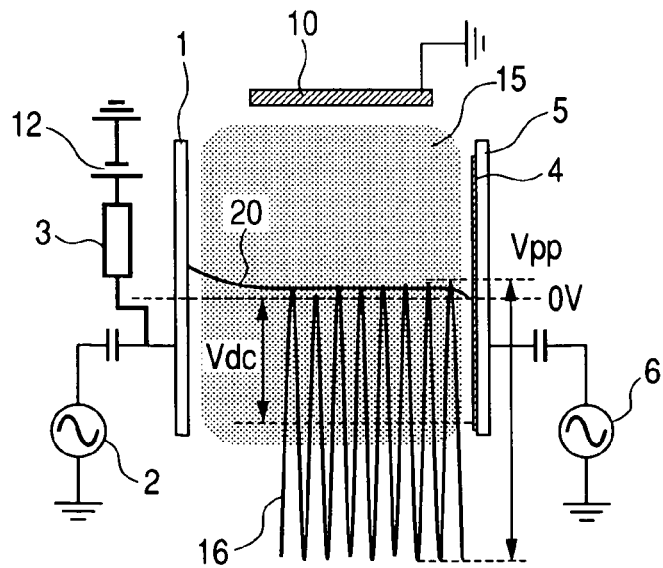
FIG. 6(a) shows a voltage waveform of a surface of a work piece in the second embodiment and FIG. 6(b) shows the temporal variation of plasma potential.
Figure 6B:
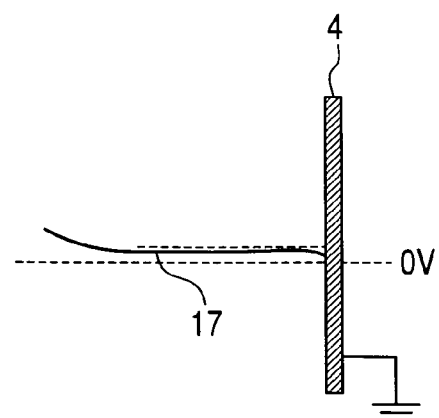

FIGS. 6(a) and 6(b) show each potential of the electrode for generating discharge 1, the wafer 4 and plasma at that time, FIG. 6(a) shows a waveform 16 of voltage applied to the surface of the wafer, and FIG. 6(b) shows the temporal variation 17 of plasma potential. As the mean potential of the electrode for generating discharge 1 can be precisely controlled to be except earth potential shown in FIG. 1, the effect of inhibiting the rise of plasma potential can be enhanced. In this embodiment, a reference number 20 denotes a waveform acquired by adding the potential of the direct-current power source 12 to plasma potential by the high frequency power source for generating discharge 2.

In this embodiment, as in the first embodiment, for a frequency of the high frequency power source for generating discharge, 50 MHz or more and 500 MHz or less are also desirable and further, for a frequency of the high frequency power source applied to the wafer, 400 kHz or more and 15 MHz or less are also desirable. For a shower plate, the similar material to that described in the first embodiment is used and it is also similar to the first embodiment whether a solenoid coil for controlling the production of plasma is used or not.

Third Embodiment

FIG. 7 shows basic configuration in a third embodiment. In the embodiment shown in FIG. 7, in addition to the second embodiment shown in FIG. 5, plasma potential control means provided with plasma potential measuring means 13 and a direct-current power source controller 14 for controlling dc voltage output from a direct-current power source 12 according to plasma potential detected by the plasma potential measuring means 13 is provided.

In the above-mentioned second embodiment, as heavy-current constantly flows in the electrode for generating discharge 1, the direct-current power source 12 and a low-pass filter 3, the heat capacity of each unit is required to be set to a large value, because dc voltage is regularly applied to the electrode for generating discharge 1, and a problem that the output of the direct-current power source 12 becomes heavy-current and the apparatus is large-sized occurs. In the meantime, in the embodiment shown in FIG. 7, only when it is determined based upon the result of detection by the plasma potential measuring means 13 that plasma potential rises, dc voltage is output from the direct-current power source 12.

FIGS. 8(a) and 8(b) show each potential of the electrode for generating discharge 1, the wafer 4 and plasma in this embodiment. FIG. 8(a) shows a waveform 16 of voltage applied to the surface of the wafer and FIG. 8(b) shows the temporal variation 17 of plasma potential. In this embodiment, ion incident energy upon a wall of a vacuum chamber becomes plasma potential (Vp) generated by only a frequency of a high frequency power source for generating discharge 2. A reference number 18 denotes a direct-current power source control signal and 19 denotes the variation of plasma potential in case the direct-current power source 12 is inactivated.

Mean current flowing in the electrode for generating discharge, the low-pass filter and the direct-current power source becomes very small owing to such configuration and the capacity of each unit is not required to be increased more than required.

In this embodiment, for a frequency for discharge and a frequency applied to the wafer, the similar frequency to that described in the first embodiment is also applied. For the material of a shower plate, the similar material to that in the first embodiment is also applied and it is also similar to the first embodiment whether a solenoid coil for controlling the production of plasma is used or not.

As described above in detail, the low-pass filter having high impedance to a frequency of the high frequency power source of generating discharge, having small resistance to direct current and grounded is connected to the electrode for generating discharge which is arranged in a position opposite to the wafer and to which the high frequency power source for generating discharge is connected or the low-pass filter having small resistance to direct current and grounded and the direct-current power source inserted in series with the low-pass filter are connected to the electrode for generating discharge. As described above, an amount of the shift to the negative side of the mean potential of the wafer when high frequency voltage is applied to the wafer is increased by grounding via the filter having small resistance to direct current or inserting the direct-current power source in series into the line between the filter having small resistance to direct current and the earth, and an amount of the shift to the positive side of plasma potential by high frequency voltage applied to the wafer is inhibited. When the amount of the shift to the positive side of plasma potential is inhibited, ion incident energy from plasma upon the wall of the vacuum chamber at earth potential is inhibited and the sputtering of the wall of the vacuum chamber is inhibited. The problem caused by the sputtering of the wall of the vacuum chamber in the conventional type such as the contamination of the wafer, the contaminant and the increase of the running cost is solved by such effect.

What is claimed is:

1. A plasma processing apparatus comprising:
   a processing chamber disposed in a vacuum chamber, said processing chamber having a side wall of which is connected to ground,
   a work piece mount which mounts a work piece on an upper surface thereof;
   an electrode for generating discharge arranged in a position opposite to the upper surface of the work piece mount, the electrode having a plate shape and including a shower plate on a surface opposite to the work piece mount, the electrode providing an electric field inside the processing chamber for generating a plasma therein;
   a first high frequency power source for applying a first high frequency voltage to the electrode for generating discharge;
   a second high frequency power source for applying a second high frequency voltage to the work piece mount, the frequency of the second high frequency voltage being 400 kHz or more and 15 MHz or less;
   a low-pass filter coupled to the electrode; and a DC power source disposed between the low-pass filter and the ground, coupled to the electrode, the DC power from the DC power source being applied to the electrode via the low-pass filter;

wherein the side wall of the processing chamber faces the plasma and is set to ground potential and the DC power applied from the DC power source to the electrode is controlled by a DC power source controller depending on a result of detecting the plasma potential when a periodical rise of the plasma potential is detected by a plasma potential measuring means connected to the DC power source controller, and wherein the periodical rise of the plasma potential is generated when a mean potential of the work piece is shifted to a negative potential caused by the high frequency voltage applied to the work piece mount.

2. A plasma processing apparatus according to claim 1, wherein:
the low-pass filter is an inductor.

3. A plasma processing apparatus according to claim 1, wherein:
the low-pass filter is a conductor having the length of a wavelength equivalent to ¼ of a frequency of the high frequency voltage for generating discharge and provided with specific characteristic impedance.

4. A plasma processing apparatus according to claim 3, further comprising a magnetic field generator arranged around the vacuum chamber.

5. A plasma processing apparatus according to claim 1, wherein:
a frequency of the high frequency voltage for generating discharge is 50 MHz or more and 500 MHz or less.

6. A plasma processing apparatus according to claim 5, further comprising a magnetic field generator arranged around the vacuum chamber.

7. A plasma processing apparatus according to claim 1, wherein:
either of conductive material or semiconductor material is arranged on the surface of the electrode arranged in a position opposite to the work piece mount.

8. A plasma processing apparatus according to claim 7, further comprising a magnetic field generator arranged around the vacuum chamber.

9. A plasma processing apparatus according to claim 1, further comprising a magnetic field generator arranged around the vacuum chamber.

* * * * *